United States Patent
Klemp

(10) Patent No.: US 11,508,878 B2
(45) Date of Patent: Nov. 22, 2022

(54) METHOD OF PRODUCING A LAYER STACK AND LAYER STACK

(71) Applicant: OSRAM OLED GmbH, Regensburg (DE)

(72) Inventor: Christoph Klemp, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 138 days.

(21) Appl. No.: 16/628,056

(22) PCT Filed: Jul. 2, 2018

(86) PCT No.: PCT/EP2018/067791
§ 371 (c)(1),
(2) Date: Jan. 2, 2020

(87) PCT Pub. No.: WO2019/007899
PCT Pub. Date: Jan. 10, 2019

(65) Prior Publication Data
US 2020/0176640 A1 Jun. 4, 2020

(30) Foreign Application Priority Data
Jul. 7, 2017 (DE) .......................... 102017115252.0

(51) Int. Cl.
*H01L 33/40* (2010.01)
*H01L 23/00* (2006.01)
(Continued)

(52) U.S. Cl.
CPC ............. *H01L 33/40* (2013.01); *H01L 24/04* (2013.01); *H01L 31/0203* (2013.01);
(Continued)

(58) Field of Classification Search
CPC ..... H01L 33/40; H01L 24/04; H01L 31/0203; H01L 33/0095; H01L 33/486; H01L 2224/04042; H01L 2933/0016
See application file for complete search history.

(56) References Cited

U.S. PATENT DOCUMENTS 5,316,974 A 5/1994 Crank
8,669,129 B2 3/2014 Miki et al.
(Continued)

FOREIGN PATENT DOCUMENTS

DE 102 29 067 1/2004

OTHER PUBLICATIONS

Gupta, R. P et al., "Diffusion of gallium in thin gold films onGaAs", *Thin Solid Films*, 151(3): pp. L121-L125, May 11, 1987.
(Continued)

*Primary Examiner* — S M Sohel Imtiaz
(74) *Attorney, Agent, or Firm* — DLA Piper LLP (US)

(57) ABSTRACT

A method of producing a layer stack includes a) forming a first layer having a first material composition on a substrate, b) performing intermediate processing of the substrate with the first layer, c) forming an additional layer having a second material composition, the first material composition and the second material composition differing from each other by at most 10% by weight, at least locally directly on the first layer and d) applying a second layer at least in places directly onto the additional layer.

16 Claims, 6 Drawing Sheets

(51) Int. Cl.
*H01L 31/0203* (2014.01)
*H01L 33/00* (2010.01)
*H01L 33/48* (2010.01)

(52) U.S. Cl.
CPC ........ H01L 33/0095 (2013.01); H01L 33/486 (2013.01); *H01L 2224/04042* (2013.01); *H01L 2933/0016* (2013.01)

(56) References Cited

U.S. PATENT DOCUMENTS

| | | | |
|---|---|---|---|
| 2004/0089898 | A1 | 5/2004 | Ruhnau et al. |
| 2008/0268632 | A1* | 10/2008 | Luh .................. H01L 24/05 438/612 |
| 2010/0044865 | A1* | 2/2010 | Torres ............... H01L 21/7682 257/751 |
| 2010/0065322 | A1 | 3/2010 | Ogawa et al. |
| 2010/0133507 | A1* | 6/2010 | Takao ................. H01L 33/04 257/13 |
| 2011/0084307 | A1* | 4/2011 | Miki ................... C23C 14/0617 257/103 |
| 2012/0267673 | A1* | 10/2012 | Okabe ................ H01L 33/40 257/99 |
| 2013/0146878 | A1* | 6/2013 | Oh .................... H01L 51/5265 257/59 |
| 2014/0034945 | A1* | 2/2014 | Tokunaga ......... H01L 21/02554 257/43 |
| 2016/0079172 | A1* | 3/2016 | Yang ................ H01L 21/76856 257/751 |
| 2016/0155663 | A1* | 6/2016 | Shih ................. H01L 21/76807 438/653 |
| 2017/0053879 | A1* | 2/2017 | Yeduru ............... H01L 24/03 |
| 2017/0110423 | A1* | 4/2017 | Gatterbauer ....... H01L 21/0272 |
| 2019/0131514 | A1* | 5/2019 | Delamare ............ H01L 41/25 |

OTHER PUBLICATIONS

Seigal, P. K. et al., "Adhesion studies of GaAs-based ohmic contact and bond pad metallization", *This Solid Films,* 290-291: pp. 503-507, 1996.

* cited by examiner

METHOD OF PRODUCING A LAYER STACK AND LAYER STACK

TECHNICAL FIELD

This disclosure relates to a method of producing a layer stack and a layer stack.

BACKGROUND

In the production of semiconductor devices, different materials are often stacked on top of each other. This can lead to adhesion problems at the interface between these materials.

It could therefore be helpful to provide a method with which a reliable adhesion between materials can be achieved easily and reliably and is characterized by high reliability.

SUMMARY

I provide a method of producing a layer stack including a) forming a first layer having a first material composition on a substrate, b) performing intermediate processing of the substrate with the first layer, c) forming an additional layer having a second material composition, the first material composition and the second material composition differing from each other by at most 10% by weight, at least locally directly on the first layer and d) applying a second layer at least in places directly onto the additional layer.

I also provide a method of producing a layer stack including a) forming a first layer having a first material composition on a substrate, b) performing intermediate processing of the substrate with the first layer, c) forming an additional layer having a second material composition, the first material composition and the second material composition differing from each other by at most 10% by weight, at least locally directly on the first layer, and d) applying a second layer at least in places directly onto the additional layer, wherein the intermediate processing modifies a surface of the first layer facing away from the substrate, and the additional layer is configured to reduce or completely suppress negative influences of the intermediate processing on the adhesion properties to the second layer, wherein a surface of the additional layer facing away from the substrate is not modified at a time of application of the second layer with respect to a time after formation of the additional layer.

I further provide a layer stack including a first layer having a first material composition, a second layer and an additional layer, wherein the additional layer directly adjoins the first layer and the second layer and includes a second material composition, wherein the first material composition and the second material composition differ from each other by at most 10% by weight.

Figure 1A:
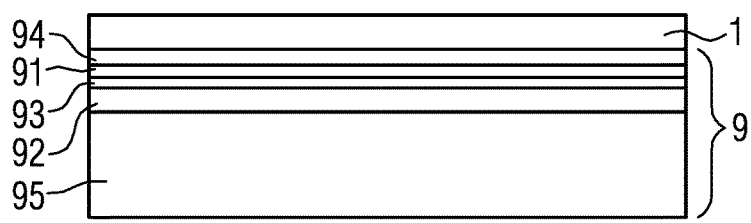
FIGS. 1A to 1D show an example of a method of producing a layer stack on the basis of intermediate steps represented in schematic sectional view.

REFERENCE SIGN LIST 1 first layer
10 surface of the first layer
2 second layer
3 additional layer
30 surface of the additional layer
4 further layer
40 opening
5 mask layer
9 substrate
91 semiconductor layer
92 further semiconductor layer
93 active region
94 metal layer
95 carrier
99 further carrier

DETAILED DESCRIPTION

I provide a method of producing a layer stack. A first layer with a first material composition may be formed on a substrate. The first material composition may comprise one or more materials. For example, the first layer is a metallic layer. For example, the first layer may contain gold, silver, aluminum, rhodium, platinum or nickel. Alternatively, the first layer contains a dielectric material such as an oxide such as silicon oxide, aluminum oxide or titanium oxide, a nitride such as silicon nitride, an oxynitride such as silicon oxynitride, or a polymer material such as BCB.

For example, the first layer is applied by chemical vapor deposition (CVD) such as plasma enhanced chemical vapor deposition (PECVD), physical vapor deposition (PVD) such as sputtering, or electroplating.

The substrate is, for example, a wafer on which no, one or several layers are arranged, for example, at least one epitaxially deposited semiconductor layer. For example, the substrate has a carrier such as a growth substrate for the epitaxial deposition of a semiconductor layer. In the lateral direction, i.e. along a main plane of the substrate, the substrate can be structured or unstructured.

An intermediate processing of the substrate with the first layer may be carried out. Intermediate processing therefore takes place at a time when the first layer is already arranged on the substrate. Intermediate processing is used, for example, for lateral structuring, the formation of further layers or the modification of at least one property of the substrate and/or the first layer, for example, the reduction of an electrical resistance by a thermal treatment, for example, at an interface between a semiconductor layer and a metal layer.

An additional layer may be formed with a second material composition. In particular, the additional layer is directly adjacent to the first layer at least in places.

The second material composition and the first material composition differ in particular by at most 10% by weight or at most 5% by weight from each other. In other words, the first material composition and the second material composition are at least 90% by weight and at least 95% by weight, respectively, the same. In particular, the first material composition and the second material composition may be nominally the same. This means that the additional layer and the first layer may be formed from the same starting material.

For example, the first layer and the additional layer differ in material composition only by a substance diffused into the first layer after the deposition of the first layer.

The methods mentioned in connection with the first layer are particularly suitable for the formation of the additional layer. The first layer and the additional layer can be formed using the same method or different methods.

A second layer may be applied directly to the additional layer at least in places. The second layer may thus be directly adjacent to the additional layer, at least in places. The first layer and the second layer can differ in their material composition. In particular, the second layer contains at least one material which is not contained in the first layer. For example, the first layer is electrically conductive and the second layer electrically insulating or vice versa.

For example, the second layer is a metallic layer. For example, the second layer contains gold, silver, aluminum, rhodium, platinum or nickel. Alternatively, the second layer contains a dielectric material such as an oxide such as silicon oxide, aluminum oxide or titanium oxide, a nitride such as silicon nitride, an oxynitride such as silicon oxynitride, or a polymer material such as BCB.

A first layer with a first material composition may be formed on a substrate. An intermediate processing of the substrate with the first layer is carried out. An additional layer with the second material composition is formed, wherein the first material composition and the second material composition differ from each other by at most 10% by weight, in particular by at most 5% by weight, wherein the additional layer is formed at least in places directly on the first layer. A second layer is applied directly to the additional layer at least in places.

Between the first layer and the second layer there is at least in places the additional layer. For example, the additional layer can be designed such that the first layer and the second layer do not directly adjoin each other at any point. The additional layer can be used to completely suppress or at least reduce negative influences of the intermediate processing on the adhesion properties to the second layer. For example, it can be avoided that an intermediate treatment using an etching method leads to an unintentional surface conditioning that impairs adhesion of the second layer. In contrast to this, adhesion to the additional layer can be sufficiently high since the first layer and the additional layer do not differ or do not differ significantly with regard to their material composition. There may therefore be a single interface between the first layer and the additional layer. Between the first layer and the second layer, on the other hand, a hetero-interface would be created.

Furthermore, such an intermediate treatment can also lead to an increase in the surface roughness of a surface of the first layer, which can also result in reduced adhesion.

The additional layer thus suppresses influences, for example, caused by the process chain between the original deposition of the first layer and the application of the second layer, in particular on the surface quality of the surface of the first layer facing the second layer.

Furthermore, the additional layer can be used to make the manufacturing process more robust to changes in the process chain between the original deposition of the first layer and the application of the second layer since a change in the intermediate processing has no or only a minor influence on the adhesion of the second layer.

The intermediate treatment may modify a surface of the first layer facing away from the substrate. In other words, the intermediate treatment causes adhesion of the second layer to the first layer after the intermediate treatment to be different, in particular worse, than before the intermediate treatment.

A surface of the additional layer facing away from the substrate need not be modified at the time of the application of the second layer compared to the time after formation of the additional layer. In other words, between formation of the additional layer and application of the second layer on the additional layer, no further intermediate processing need take place which would lead to a surface modification of the additional layer. At the time of the application of the second layer, the surface of the additional layer may thus have essentially the same properties as immediately after the formation of the additional layer on the first layer.

The intermediate treatment may include a temperature treatment. Temperature treatment is generally considered to be a step in which the temperature of the substrate is increased above room temperature, for example, to at least 50° C., at least 100° C., or at least 200° C. The temperature of the substrate is determined by the temperature of the substrate. In a temperature treatment, material of the substrate, for example, material of a metal layer of the substrate, can diffuse to the surface of the first layer and thereby reduce the adhesion properties to the second layer.

For example, the temperature treatment is intended to reduce contact resistance between individual layers of the substrate.

By the additional layer applied after the temperature treatment, a negative influence of the temperature treatment on the adhesion properties to the second layer can be avoided or at least reduced.

The intermediate treatment may involve application of a further layer and, in particular, the structuring of the further layer to expose the first layer in certain areas. The further layer is, for example, a dielectric layer such as an oxide layer, a nitride layer or an oxynitride layer. Alternatively, the further layer can also be a metal layer.

When the first layer is exposed, for example, by a wet-chemical or dry-chemical etching method, surface conditioning of the exposed area of the first layer may occur. By the additional layer, negative consequences for the adhesion of the second layer can be avoided or at least reduced.

A mask layer may be applied to structure the further layer. In particular, the additional layer can be formed before the mask layer is removed. The mask layer already used for structuring the further layer may therefore also be used to structure the additional layer. The additional layer can therefore be structured laterally without the need for an additional photolithography layer. For example, the mask layer is a photoresist layer. Such layers can be removed by comparatively gentle etching methods so that no or at least no significant undesired surface conditioning of the additional layer takes place.

The additional layer may only cover the first layer in places. For example, the first layer is covered in places by the additional layer and in places by the further layer.

The second layer may be formed on the additional layer. For example, a deposition method such as a PVD method, a CVD method or a galvanic method is suitable. The second layer is thus a layer deposited on the additional layer.

The second layer may be bonded to the additional layer by a direct bonding method. In a direct bonding method, the in particular prefabricated joining partners to be joined are joined together by the action of pressure and/or temperature, without the need for a connecting layer between the joining partners. The joint can be formed by hydrogen bonds and/or Van der Waals interactions. The second layer is thus formed separately from the additional layer, for example, by deposition on a further carrier, and is attached to the additional layer after deposition.

The first layer may be electrically conductive and the second layer may be electrically insulating or vice versa. In other words, the first layer may be a conductor and the second layer may be an insulator, or vice versa. The first layer and the second layer therefore may differ fundamentally in their electrical conductivity. The electrically conductive layer, for example, is metallic.

The additional layer may have a thickness of 1 nm to 100 nm. Even a comparatively small thickness of the additional layer is sufficient to suppress negative influences of the intermediate processing. In particular, the thickness of the additional layer may be 2 nm to 20 nm. Furthermore, the thickness of the additional layer may be lower than that of the first layer.

I also provide a layer stack.

The layer stack may comprise a first layer having a first material composition, a second layer and an additional layer, the additional layer being immediately adjacent to the first layer and the second layer and having a second material composition that differs from the first material composition by at most 10% by weight, for instance by at most 5% by weight. Adhesion of the layers to each other can be increased by the additional layer.

The layer stack may be part of an optoelectronic semiconductor device. For example, the optoelectronic semiconductor device has at least one semiconductor layer, which is epitaxially deposited.

The first layer may be a metallic layer that electrically contacts a semiconductor layer of the optoelectronic semiconductor device. For example, the second layer is an electrically insulating layer arranged on the side of the first layer facing away from the semiconductor layer.

The method described above is particularly suitable for producing the layer stack described above. Features described in connection with the method can therefore also apply for the layer stack and vice versa.

Further configurations and expediencies become apparent from the following description of examples in connection with the figures.

Identical, similar or similarly acting elements are provided with the same reference signs in the figures.

The figures are schematic representations and therefore not necessarily true to scale. Rather, comparatively small elements and, in particular, layer thicknesses, can be represented exaggeratedly large for clarification.

Figure 1B:
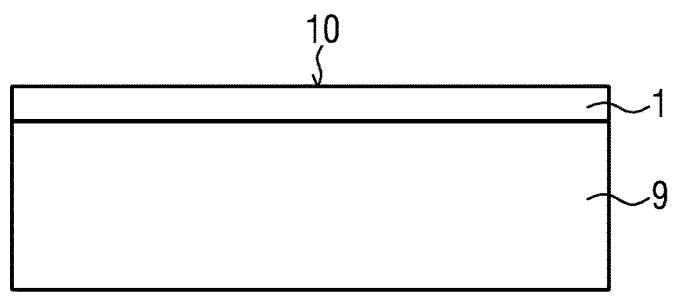
Figure 1C:
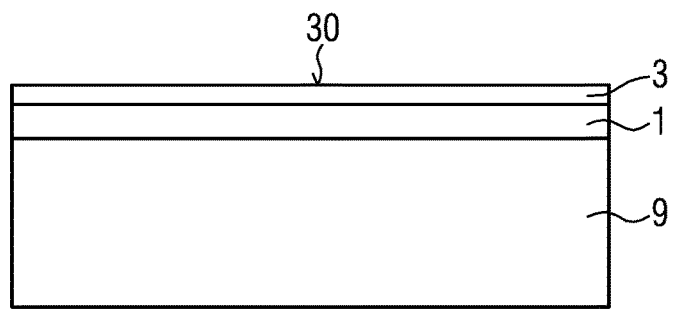
Figure 1D:
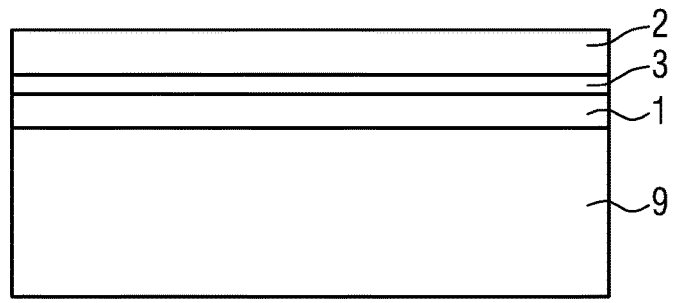
Figure 2A:
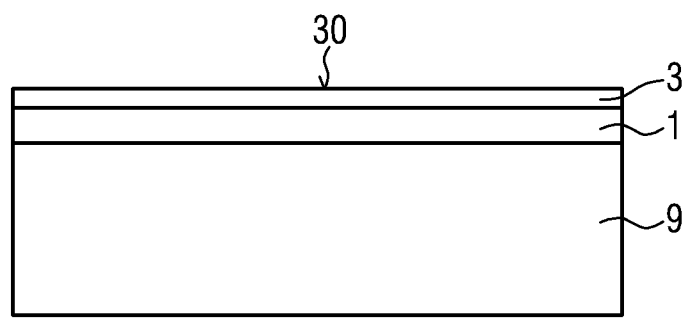
FIGS. 2A to 2C show an example of a method of producing a layer stack on the basis of intermediate steps represented in schematic sectional view.
Figure 2B:
Figure 2C:
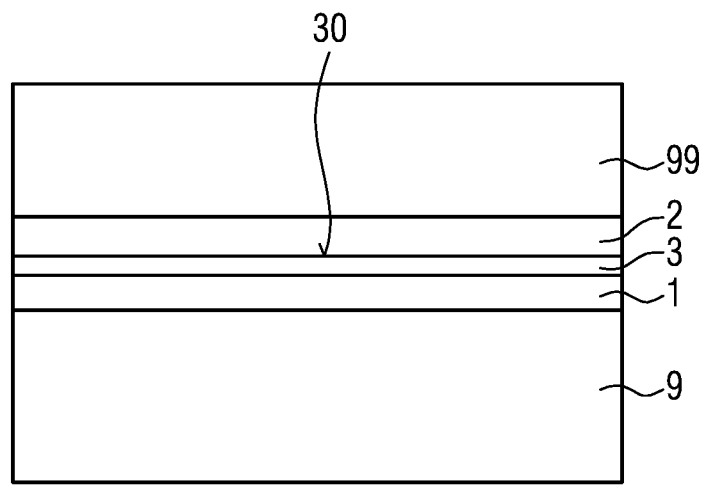
Figure 3A:
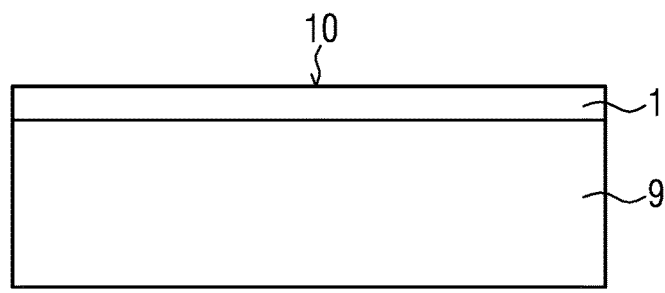
FIGS. 3A to 3F show an example of a method of producing a layer stack on the basis of intermediate steps represented in schematic sectional view.
Figure 3B:
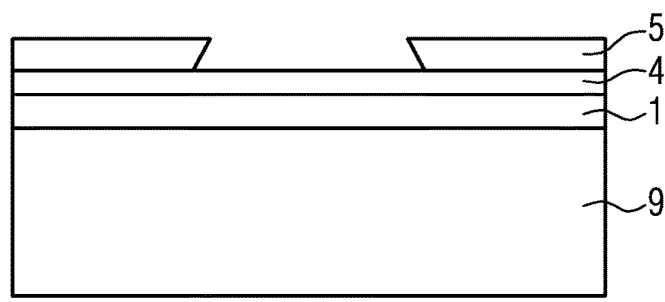
Figure 3C:
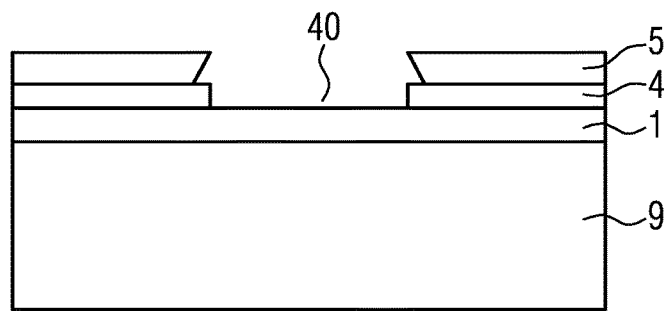
Figure 3D:
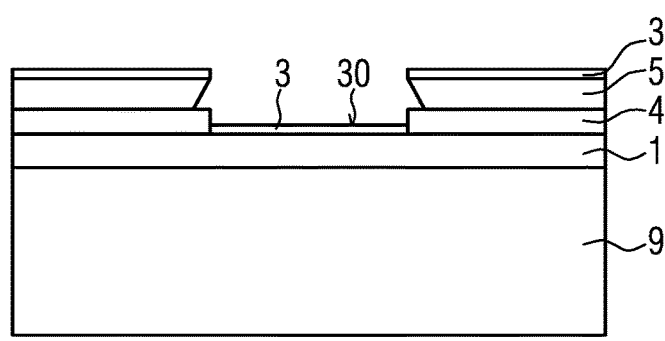
Figure 3E:
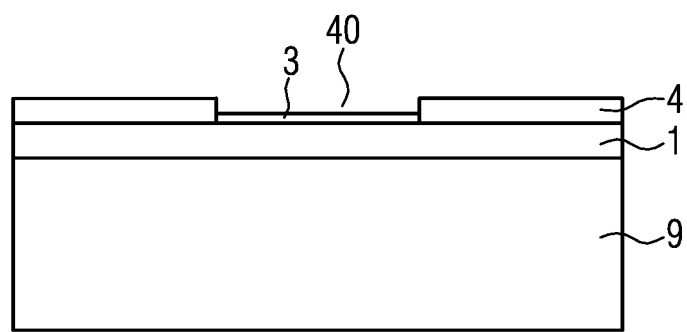
Figure 3F:
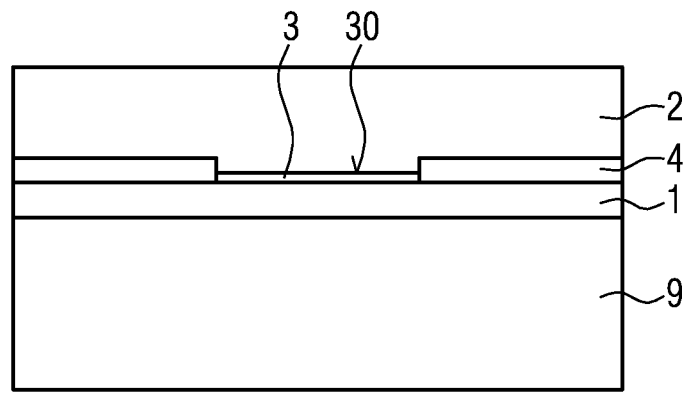
Figure 4A:
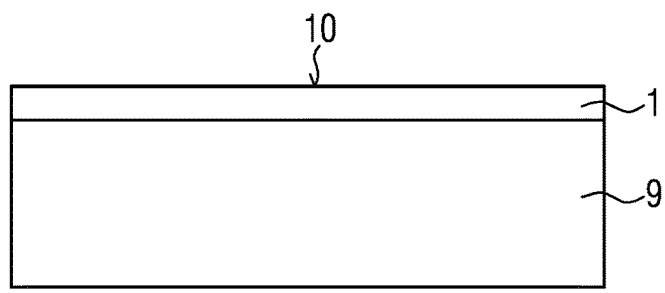
FIGS. 4A to 4F show an example of a method of producing a layer stack on the basis of intermediate steps represented in schematic sectional view.
Figure 4B:
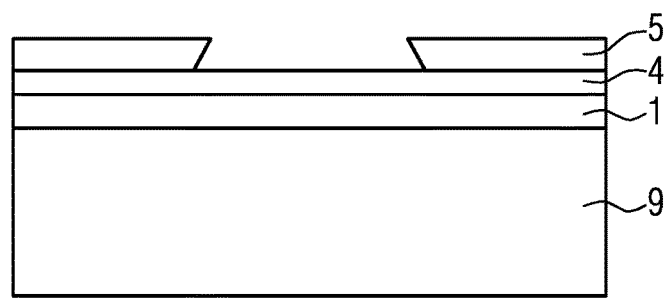
Figure 4C:
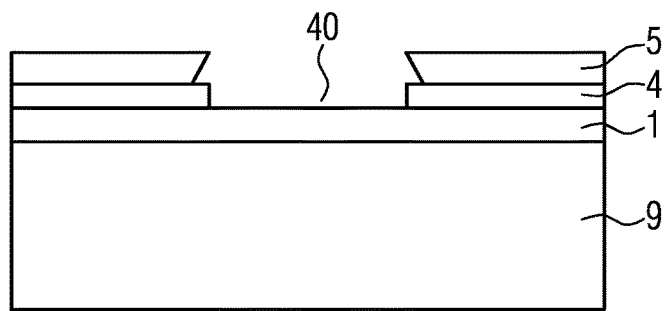
Figure 4D:
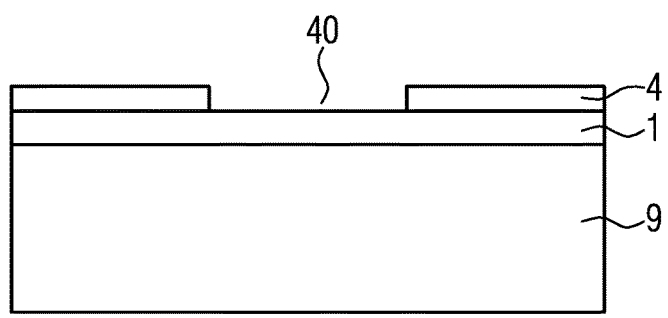
Figure 4E:
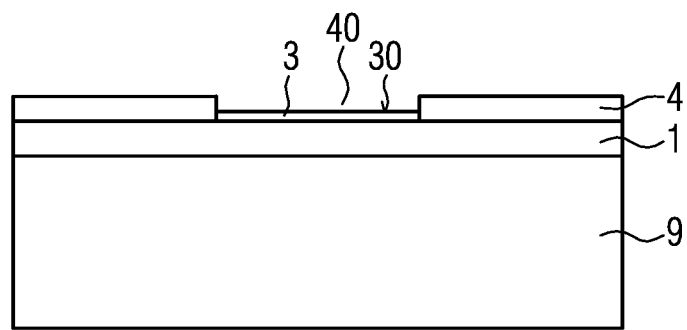
Figure 4F:
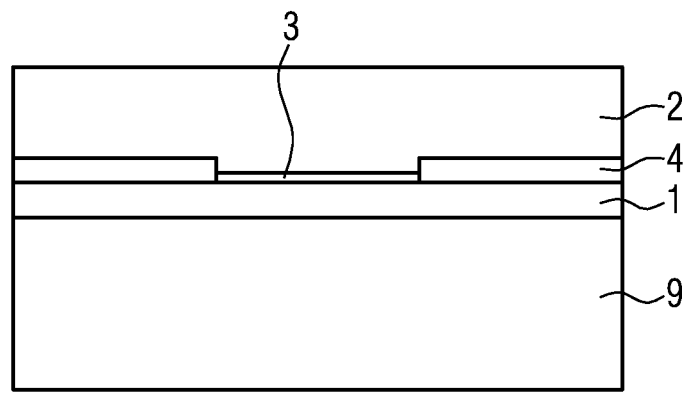

An example of a method of producing a layer stack is shown in FIGS. 1A to 1D, where FIG. 1D, like FIGS. 2C, 3F and 4F, is an example of a layer stack.

A first layer 1 having a first material composition is formed on a substrate 9 (FIG. 1A). The structural composition of the substrate can be varied within wide limits, both in a lateral direction and in a vertical direction, i.e. perpendicular to a main extension plane of the substrate.

FIG. 1A illustrates an example in which the substrate 9 has a carrier 95 and layers arranged on the carrier 95. In particular, a semiconductor layer 91, a further semiconductor layer 92 and an active region 93 arranged between the semiconductor layer 91 and the further semiconductor layer 92 are arranged on the carrier 95. These semiconductor layers comprise, for example, a III-V compound semiconductor material or a II-VI compound semiconductor material.

The first layer 1 may be directly adjoin the semiconductor layer 91. Alternatively, the first layer 1 may be adjacent to a metal layer 94 as shown in FIG. 1A. The substrate 9 and/or the first layer can be structured in lateral direction. For example, the substrate 9 has a recess that extends through the active region 9, e.g. for electrical contacting of the further semiconductor layer 92 or for lateral structuring of the active region into individual segments. As carrier 95, for example, a growth substrate is suitable for the epitaxial deposition of semiconductor layers 91, 92, 93 such as sapphire, silicon carbide, gallium arsenide or silicon, or a carrier different from a growth substrate for the semiconductor layers. For the sake of simplification, the sequence of layers of substrate 9 shown as an example in FIG. 1A is not shown in the following figures. In particular, one, several or even all of the shown layers of substrate 9 may be present in the further examples.

As shown in FIG. 1B, the substrate 9 with the first layer 1 arranged on it is subjected to an intermediate processing. For example, intermediate processing is a heating step in which an ohmic contact is established between the metal layer 94 and the semiconductor layer 91. In such a heating step, material of the metal layer 94, for example, nickel, can diffuse into the first layer 1 and thus modify a surface 10 of the first layer facing away from the substrate 9.

Subsequently, as shown in FIG. 1C, an additional layer 3 is formed with a second material composition, the additional layer 3 being immediately adjacent to the first layer 1. The second material composition does not differ from the first material composition or at least not substantially, for example, by at most 10% by weight or by at most 5% by weight. Due to the same or at least similar material composition, the first layer 1 and the additional layer 3 adhere reliably to each other despite the intermediate processing step.

A CVD method, a PVD method or a galvanic method are suitable for deposition of the first layer 1 and the additional layer 3, whereby the same deposition method or different deposition methods can be used for the deposition of the first layer 1 and the additional layer 3.

For example, a thickness of the additional layer is 1 nm to 100 nm, and in particular 3 nm to 20 nm.

Subsequently, as shown in FIG. 1D, a second layer 2 is applied to substrate 9. The second layer 2 is at least in places directly adjacent to the additional layer 3. In particular, the second layer 2 does not adjoin the first layer 1 directly at any point. Deviating from this, however, it is also possible that the second layer 2 in places adjoins the first layer, as long as the places at which the second layer adjoins the additional layer provide overall sufficient adhesion of the second layer. The second layer 2 is, for example, applied to the additional layer 3 by a deposition method such as a CVD method or a PVD method.

For the first layer 1, the additional layer 2 and the second layer 2 the materials mentioned in the general part of the description are particularly suitable, for example, gold for an electrically conductive first layer 1 and for the additional layer 3 as well as BCB for an electrically insulating second layer 2.

In particular, there is no further intermediate processing between the application of the additional layer 3 and the application of the second layer 2 on the additional layer which can lead to a surface modification of the surface 30 of the additional layer facing away from the substrate 9. In particular, surface 30 is not exposed to any plasma method, aggressive etching method or temperature treatment before the second layer 2 is applied.

With the described method, the second layer 2 is thus applied to a layer whose surface has as far as possible the properties it exhibits immediately after deposition. Influences caused by the intermediate processing, which could lead to a reduced adhesion of the second layer 2, can thus be suppressed or at least reduced. This means that good adhesion can also be achieved for a second layer that differs strongly or even completely from the first layer 1 in terms of its material composition.

In the example described, the first layer is electrically conductive and the second layer is electrically insulating. However, the first layer can also be electrically insulating and the second layer electrically conductive. It is also possible that both the first layer 1 and the second layer 2 are electrically insulating or that both the first layer 1 and the second layer 2 are electrically conductive.

FIGS. 2A to 2C show another example of a method. This example corresponds essentially to the example described in FIGS. 1A to 1D. In particular, formation of the first layer 1 and the intermediate processing can take place as described in connection with FIGS. 1A and 1B.

The second layer 2 is provided on a further carrier 99 as shown in FIG. 2B. Then the prefabricated second layer 2 is attached to the additional layer 3 (FIG. 2C). This is done in particular by a direct bond connection so that the second layer 2 and the additional layer 3 at least in places directly adjoin each other. Despite the intermediate processing step for the direct bond connection, the additional layer 3 thus offers a surface 30 not affected by the intermediate processing. A direct bond connection can thus be formed particularly reliably between the second layer 2 and the additional layer 3.

FIGS. 3A to 3F show another example of a method. This example corresponds essentially to the example described in connection with FIGS. 1A to 1D.

In contrast to this, a further layer 4 and a mask layer 5 are applied as intermediate processing after formation of the first layer 1 and application of the second layer 2. In areas of the further layer 4 not covered by mask layer 5, openings 40 are formed in the further layer in which the first layer 1 is exposed (FIG. 3C).

Subsequently, the additional layer 3 is applied (FIG. 3D). In the openings 40, the additional layer 3 directly adjoins the first layer 1. The additional layer 3 is applied in particular before the mask layer 5 is removed. The additional layer therefore also covers the mask layer 5. The mask layer 5 intended for formation of the openings 40 therefore also serves for the lateral structuring of the additional layer 3. After removing the mask layer 5, the additional layer 3 is only present in the area of the openings 40 (FIG. 3E).

During the lateral structuring of the further layer 4 and the exposure of the first layer 1, the surface 10 of the first layer 1 is subjected to a plasma method, for example, which could reduce adhesion to the second layer 2. With the additional layer 3, however, the second layer 2 does not adjoin the surface 10 of the first layer 1, but the surface 30 of the additional layer 3 so that possible negative influences of the plasma method on the adhesion properties of the second layer 2 can be avoided. The additional layer 3 does not have to cover the entire surface of the first layer 1 for this purpose.

Deviating from the illustration shown, the second layer 2 may also in places adjoin the first layer 1, as long as a sufficiently strong adhesion of the second layer 2 is ensured by means of the additional layer 3.

The example shown in FIGS. 4A to 4D essentially corresponds to the example described in connection with FIGS. 3A to 3F. In particular, a further layer 4 is also applied as intermediate processing and structured in the lateral direction by means of a mask layer 5 (FIGS. 4A to 4C).

As shown in FIG. 4D, the mask layer 5 is removed before the additional layer 3 is applied. The additional layer 3 is applied by a galvanic method, for example, so that deposition of the additional layer 3 only takes place in the areas where the electrically conductive first layer 1 is exposed. In contrast, the additional layer 3 is not deposited on the further layer 4. Subsequently, the second layer 2, as shown in FIG. 4F, can be applied to the additional layer 3.

In this example, no mask layer 5 is required for laterally structuring the additional layer 3, which only partially covers the first layer 1. Rather, the lateral structuring is already achieved by the type of deposition of the additional layer 3.

With the described methods a layer stack can be produced in a simple and reliable way, in which good adhesion between the individual layers, i.e. between the first layer and the additional layer as well as between the additional layer and the second layer, can be achieved by the additional layer. Such a layer stack can, for example, be part of a semiconductor device, especially an optoelectronic semiconductor device. For example, the first layer can be a metallic layer that electrically contacts a semiconductor layer of the optoelectronic semiconductor device. The second layer can be an electrically insulating layer, which, for example, is arranged on the side of the first layer facing away from the semiconductor layer.

In addition to the improved adhesion between the layers, the flexibility of the process control is also increased since a modification of the intermediate processing has no or at least only a reduced influence on the adhesion of subsequently applied layers.

This application claims priority of DE 10 2017 115 252.0, the subject matter of which is incorporated herein by reference.

My methods and layer stacks are not restricted to the examples by the description on the basis of the examples. Rather, this disclosure encompasses any new feature and also any combination of features, which in particular comprises any combination of features in the appended claims and any combination of features in the examples, even if the feature or combination itself is not explicitly specified in the claims or examples.

The invention claimed is:

1. A method of producing a layer stack comprising:
    a) forming a first layer having a first material composition on a substrate;
    b) performing intermediate processing of the substrate with the first layer;
    c) forming an additional layer having a second material composition, said first material composition and said second material composition differing from each other by at most 10% by weight, at least locally directly on said first layer; and
    d) applying a second layer at least in places directly onto the additional layer;
wherein
    the intermediate processing modifies a surface of the first layer facing away from the substrate, and
    the additional layer is configured to reduce or completely suppress negative influences of the intermediate processing on the adhesion properties to the second layer, wherein a surface of the additional layer facing away from the substrate is not modified at a time of application of the second layer with respect to a time after formation of the additional layer.

2. The method according to claim 1, wherein the intermediate processing includes a temperature treatment such that material of the substrate diffuses to the surface of the first layer.

3. The method according to claim 1, wherein the intermediate processing comprises applying a further layer and structuring the further layer to expose the first layer regionally.

4. The method according to claim 3, wherein a mask layer is applied to structure the further layer and the additional layer is formed before the mask layer is removed.

5. The method according to claim 1, wherein the additional layer covers the first layer only in places.

6. The method according to claim 1, wherein the second layer is formed on the additional layer in c).

7. The method according to claim 1, wherein the second layer is bonded to the additional layer by a direct bonding method.

8. The method according to claim 1, wherein the first layer is electrically conductive and the second layer is electrically insulating, or vice versa.

9. The method according to claim 1, wherein the additional layer has a thickness of 1 nm to 100 nm.

10. The method according to claim 1, wherein the first layer, the additional layer and the second layer are non-semiconductor layers.

11. A layer stack comprising a first layer having a first material composition, a second layer and an additional layer, wherein 1) the additional layer directly adjoins the first layer and the second layer and comprises a second material composition, 2) the first material composition and the second material composition differ from each other by at most 10% by weight, and 3) the first layer is electrically conductive and the second layer is electrically insulating or vice versa, the additional layer having a thickness of 1 nm to 100 nm.

12. The layer stack according to claim 11, wherein an increased adhesion between the layers of the layer stack is achieved by the additional layer.

13. The layer stack according to claim 11, wherein the layer stack is part of an optoelectronic semiconductor device.

14. The layer stack according to claim 13, wherein the first layer is a metallic layer electrically contacting a semiconductor layer of the optoelectronic semiconductor device, and the second layer is an electrically insulating layer arranged on the side of the first layer facing away from the semiconductor layer.

15. The layer stack according to claim 11, wherein the additional layer has a thickness of 1 nm to 20 nm.

16. The layer stack according to claim 11, wherein the first layer, the additional layer and the second layer are non-semiconductor layers.

* * * * *